(12) United States Patent
Goedken

(10) Patent No.: US 9,369,219 B1
(45) Date of Patent: Jun. 14, 2016

(54) RADIO FREQUENCY SYSTEMS AND METHODS FOR CONTROLLING SPURIOUS EMISSIONS

(71) Applicant: APPLE INC., Cupertino, CA (US)

(72) Inventor: Ryan Joseph Goedken, Santa Clara, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/635,660

(22) Filed: Mar. 2, 2015

(51) Int. Cl.
  *H04B 3/46* (2015.01)
  *H04B 17/14* (2015.01)
  *H04B 1/04* (2006.01)

(52) U.S. Cl.
  CPC .............. *H04B 17/14* (2015.01); *H04B 1/0475* (2013.01)

(58) Field of Classification Search
  CPC ................................ H04L 1/20; H04B 17/006
  USPC .................................................. 375/227, 224
  See application file for complete search history.

(56) References Cited

U.S. PATENT DOCUMENTS

| | | | |
|---|---|---|---|
| 5,193,210 A * | 3/1993 | Nicholas et al. | 455/226.3 |
| 5,852,630 A * | 12/1998 | Langberg et al. | 375/219 |
| 6,236,267 B1 | 5/2001 | Anzil | |
| 6,621,340 B1 * | 9/2003 | Perthold et al. | 330/149 |
| 7,248,642 B1 | 7/2007 | Vella-Coleiro | |
| 8,670,730 B2 | 3/2014 | Shafer | |
| 8,837,620 B2 | 9/2014 | Ho et al. | |
| 2005/0057303 A1* | 3/2005 | Leffel | 330/75 |
| 2013/0083703 A1* | 4/2013 | Granger-Jones et al. | 370/277 |

* cited by examiner

*Primary Examiner* — Helene Tayong
(74) *Attorney, Agent, or Firm* — Fletcher Yoder PC

(57) ABSTRACT

Systems and method for improving performance of a radio frequency system are provided. One embodiment describes a radio frequency system, which includes an antenna that wirelessly transmits analog electrical signals at a desired transmission frequency; a feedback receiver that determines a feedback signal, which includes a portion of a transmitted analog electrical signal via a coupler; and a controller that determines location and magnitude of spurious emissions transmitted at frequencies other than the desired transmission frequency by comparing the feedback signal with a desired signal, in which the desired signal includes a digital electrical signal that does not contain noise introduced by the radio frequency system; and instructs the radio frequency system to adjust operational parameters used to transmit the analog electrical signals when the magnitude of the spurious emissions exceeds a spurious emissions limit at the determined location.

13 Claims, 8 Drawing Sheets

RADIO FREQUENCY SYSTEMS AND METHODS FOR CONTROLLING SPURIOUS EMISSIONS

BACKGROUND

The present disclosure relates generally to radio frequency systems and, more particularly, to controlling spurious emissions produced by a radio frequency system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices may include a radio frequency system to facilitate wireless communication of data with other electronic devices and/or a network. The radio frequency system may include a transceiver that receives a digital representation of data as a digital electrical signal and generates an analog representation of the data as an analog electrical signal. A power amplifier may then amplify the analog electrical signal to a desired output power for wireless transmittance via an antenna at a desired radio frequency, such as an assigned resource block or channel. As used herein, a "channel" is intended to describe a range of frequencies and a "resource block" is intended to describe a range of frequencies within the channel.

Generally, regulations on wireless transmissions are set by regulatory bodies, such as the Federal Communications Commission (FCC) in the United States, Industry Canada (IC) in Canada, the Ministry of Internal Affairs and Communications (MIC) in Japan, and the European Telecommunications Standards Institute (ETSI) in Europe. More specifically, such regulatory bodies may set allowable spurious emissions limits for radio frequency systems, particularly in protected or restricted frequency bands. As used herein, a "frequency band" is intended to describe a range of radio frequencies including multiple channels and "spurious emissions" are intended to describe wireless signal transmission at frequencies other than a desired transmission frequency.

In some embodiments, spurious emissions may be the result of noise introduced into the analog electrical signal, for example, by the transceiver and/or the power amplifier. As a result, when the antenna transmits the analog electrical signal at a desired transmission frequency, spurious emissions may also be transmitted at other frequencies. More specifically, the magnitude and location (e.g., frequency) of the spurious emissions may be affected by operational parameters, such as ambient temperature, transmission frequency, output power, antenna load, and the like. In other words, even though the operational parameters may change, the radio frequency system should still operate to meet any spurious emissions limits.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to improving performance of a radio frequency system by controlling operation of the radio frequency system based at least in part on output spurious emissions. Generally, the radio frequency system may wirelessly communicate data with other electronic devices and/or a network by modulating radio waves at a desired transmission frequency based on an analog representation of the data (e.g., an analog electrical signal). However, the analog electrical signal may contain noise introduced by the components in the radio frequency system, which may cause the radio frequency system to transmit spurious emissions at other frequencies.

Although some amount of spurious emissions may be acceptable, the radio frequency system should still operate within set spurious emissions limits, particularly at protected or restricted frequency bands. However, the amount of spurious emissions transmitted by the radio frequency system may be dependent on the operational parameters, such as ambient temperature, transmission frequency, output power, antenna load, and the like. In other words, the amount of spurious emissions may be dynamic over operation of the radio frequency system.

Accordingly, the techniques described herein may improve operation of the radio frequency system by enabling dynamic control based at least in part on spurious emissions. In some embodiments, the radio frequency system may include a coupler that feeds back the analog electrical signal transmitted by an antenna to a feedback receiver. The feedback receiver may then compare the feedback signal with an ideal desired signal (e.g., a digital electrical signal). Based at least in part on the comparison, the radio frequency system may determine distortion (e.g., spurious emission) in the transmitted analog electrical signal introduced by the radio frequency system (e.g., a power amplifier and/or a transceiver). In some embodiments, the feedback receiver may be tuned to determine the spurious emissions at a particular out of band frequency (e.g., frequency outside of desired transmission frequency). In other embodiments, the feedback receiver may determine the spurious emissions at a range of frequencies around the transmission frequency, which may then be used to determine spurious emissions at other frequencies.

In this manner, the radio frequency system may determine the location (e.g., frequency) and/or magnitude of spurious emissions transmitted and adjust operational parameters of the radio frequency system when necessary. More specifically, the radio frequency system may operate using nominal operational parameters when the nominal operational parameters do not result in exceeding spurious emissions limits. However, when spurious emissions limits are exceeded, the radio frequency system may adjust operational parameters of the radio frequency system away from the nominal operational parameters. For example, in some embodiments, the radio frequency system may increase filter rejection, decrease amplification by a power amplifier, increase power amplifier linearity, adjust the skew of the power amplifier emissions (e.g., favor emissions on one side of the transmission frequency, which may land in a protected band, at the expense of emissions on the other side, which may have no emissions constraints), or any combination thereof.

However, adjustments of operational parameters away from the nominal operational parameters may affect performance of the radio frequency system, particularly power consumption, efficiency, and/or output power. As such, the techniques provided herein enable performance of the radio frequency system to be improved by predominantly using nominal operational parameters and dynamically adjusting the operational parameters of the radio frequency system based on spurious emissions.

BRIEF DESCRIPTION OF THE DRAWINGS

Various aspects of this disclosure may be better understood upon reading the following detailed description and upon reference to the drawings in which.

DETAILED DESCRIPTION

Figure 1:
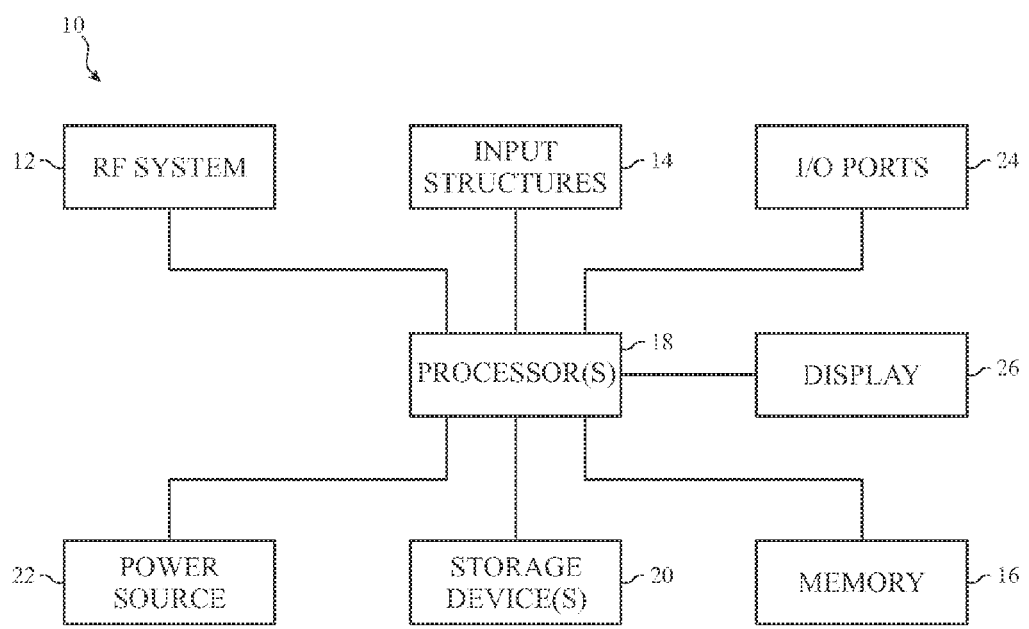
FIG. 1 is a block diagram of a electronic device with a radio frequency system, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, an electronic device may include a radio frequency system to facilitate wirelessly communicating data with another electronic device and/or a network. More specifically, the radio frequency system may modulate radio waves at a desired radio frequency, such as an assigned one or more resource block or channel, to enable the electronic device to communicate via a personal area network (e.g., Bluetooth network), a local area network (e.g., an 802.11x Wi-Fi network), and/or a wide area network (e.g., a 4G or LTE cellular network). In other words, the radio frequency systems may utilize various wireless communication protocols to facilitate communication of data.

Nevertheless, radio frequency systems may generally be operationally similar regardless of the wireless communication protocol used. For example, to transmit data, processing circuitry may generate a digital representation of the data as a digital electrical signal and a transceiver (e.g., a transmitter and/or a receiver) may then convert the digital electrical signal into one or more analog electrical signals. The analog electrical signal may then be amplified by a power amplifier, filtered by one or more filters, and transmitted by an antenna.

However, along with the data, the radio frequency system may also transmit spurious emissions. In some embodiments, the spurious emissions may be the result of noise introduced into the analog electrical signal by the transceiver and/or the power amplifier. For example, the transceiver may introduce noise as a result of digital signal modulation or analog impairments in the modulator, mixer, or driver amplifier and the power amplifier may introduce noise as a result of non-linearities. In some embodiments, adjacent channel leakage ratio (ACLR) may be used as a metric for spurious emissions levels outside the desired transmission frequency (e.g., allocated transmission channel).

In some instances, the spurious emissions may be transmitted at frequencies other than a desired transmission frequency. More specifically, spurious emissions may leak into frequencies surrounding the transmission frequency. For example, a radio frequency system transmitting a 10 MHz wide channel centered at 700 MHz (e.g., 695-705 MHz allocated bandwidth), may generate adjacent channel spurious emissions due to 3rd order products between 685-715 MHz, 5th order products between 675-725 MHZ, and so on with higher order products. Additionally, spurious emissions may occur at harmonics of the transmission frequency. For example, continuing with the above example, spurious emissions may occur at 1400 MHz (e.g., second harmonic), 2100 MHz (e.g., third harmonic), and so on.

However, regulatory bodies generally place a limit on amount of acceptable spurious emissions. In fact, some regulatory bodies may restrict wireless transmission at certain frequencies and only allow spurious emissions below a specified limit. For example, the FCC mandates that only spurious emissions are permitted at frequencies between 608-614 MHz. Moreover, the FCC mandates that the magnitude of the spurious emissions be less than 200 microvolts/meter.

As such, a radio frequency system should operate such that spurious emissions are lower than the set limits. Generally, spurious emissions vary based on operational parameters, such as ambient temperature, transmission frequency, output power, antenna load, and the like. For example, spurious emissions may increase as temperature increases. Additionally, spurious emissions are more likely to fall within protected frequencies when the transmission frequency is closer to the protected frequencies. Furthermore, magnitude of spurious emissions may increase as magnitude (e.g., output power) of the transmitted analog electrical signals is increased. In other words, the position (e.g., frequency) and magnitude of spurious emissions may dynamically vary over the course of operation of the radio frequency system.

Accordingly, as will be described in more detail below, performance of the radio frequency system may be improved by dynamically controlling operational parameters of the radio frequency system based at least in part on spurious emissions. In some embodiments, the radio frequency system may determine spurious emissions based at least in part on feedback of the analog electrical signal transmitted by the antenna. More specifically, the radio frequency system may determine location and/or magnitude of any spurious emissions by comparing the feedback signal (e.g., portion of the transmitted analog electrical signal) with a desired signal (e.g., ideal digital electrical signal), which does not include noise introduced by the radio frequency system.

Based on the determined spurious emissions, the radio frequency system may adjust operational parameters of the radio frequency system, particularly when the spurious emissions exceeded set limits. More specifically, when below spurious emissions limits, the radio frequency system may operate using nominal operational parameters. On the other hand, when limits are exceeded, the radio frequency system may adjust operational parameters of the radio frequency system. For example, the radio frequency system may increase filter rejection, decrease amplification by a power amplifier, increase power amplifier linearity, adjust the skew of the power amplifier emissions (e.g., favor emissions on one side of the transmission frequency, which may land in a protected band, at the expense of emissions on the other side, which may have no emissions constraints), or any combination thereof.

However, adjustments away from the nominal operational parameters may affect performance of the radio frequency system. For example, increasing filter rejection and/or output power may reduce reliability of transmissions by the radio frequency system. Additionally, increasing the filter rejection and/or increasing linearity of the power amplifier may increase power consumption, thereby decreasing efficiency (e.g., output power/DC power consumption). Furthermore, adjusting skew of the power amplifier may introduce spurious emissions at other frequencies.

In other words, the techniques may improve performance of a radio frequency system by predominantly using the nominal operational parameters and dynamically adjusting the operational parameters of the radio frequency system based on spurious emissions. To help illustrate, an electronic device 10 that may utilize a radio frequency system 12 is described in FIG. 1. As will be described in more detail below, the electronic device 10 may be any suitable electronic device, such as a handheld computing device, a tablet computing device, a notebook computer, and the like.

Accordingly, as depicted, the electronic device 10 includes the radio frequency system 12, input structures 14, memory 16, one or more processor(s) 18, one or more storage devices 20, a power source 22, input/output ports 24, and an electronic display 26. The various components described in FIG. 1 may include hardware elements (including circuitry), software elements (including instructions stored on a non-transitory computer-readable medium), or a combination of both hardware and software elements. It should be noted that FIG. 1 is merely one example of a particular implementation and is intended to illustrate the types of components that may be present in the electronic device 10. Additionally, it should be noted that the various depicted components may be combined into fewer components or separated into additional components. For example, the memory 16 and a storage device 20 may be included in a single component.

As depicted, the processor 18 is operably coupled with memory 16 and the storage device 20. More specifically, the processor 18 may execute instruction stored in memory 16 and/or the storage device 20 to perform operations in the electronic device 10, such as instructing the radio frequency system 12 to communicate with another device. As such, the processor 18 may include one or more general purpose microprocessors, one or more application specific processors (ASICs), one or more field programmable logic arrays (FPGAs), or any combination thereof. Additionally, memory 16 and/or the storage device 20 may be a tangible, non-transitory, computer-readable medium that stores instructions executable by and data to be processed by the processor 18. For example, the memory 16 may include random access memory (RAM) and the storage device 20 may include read only memory (ROM), rewritable flash memory, hard drives, optical discs, and the like.

Additionally, as depicted, the processor 18 is operably coupled to the power source 22, which provides power to the various components in the electronic device 10. As such, the power source 22 may includes any suitable source of energy, such as a rechargeable lithium polymer (Li-poly) battery and/or an alternating current (AC) power converter. Furthermore, as depicted, the processor 18 is operably coupled with I/O ports 24, which may enable the electronic device 10 to interface with various other electronic devices, and input structures 14, which may enable a user to interact with the electronic device 10. Accordingly, the inputs structures 14 may include buttons, keyboards, mice, trackpads, and the like. Additionally, in some embodiments, the electronic display 26 may include touch sensitive components.

In addition to enabling user inputs, the electronic display 26 may display image frames, such as a graphical user interface (GUI) for an operating system, an application interface, a still image, or video content. As depicted, the display is operably coupled to the processor 18. Accordingly, the image frames displayed by the electronic display 26 may be based on display image data received from the processor 18.

As depicted, the processor 18 is also operably coupled with the radio frequency system 12, which may facilitate communicatively coupling the electronic device 10 to one or more other electronic devices and/or networks. For example, the radio frequency system 12 may enable the electronic device 10 to communicatively couple to a personal area network (PAN), such as a Bluetooth network, a local area network (LAN), such as an 802.11x Wi-Fi network, and/or a wide area network (WAN), such as a 4G or LTE cellular network. As can be appreciated, the radio frequency system 12 may enable communication using various communication protocols.

Operational principles of the radio frequency system 12 may be similar for each of the communication protocols (e.g., Bluetooth, LTE, 802.11x Wi-Fi, etc). More specifically, as will be described in more detail below, the radio frequency system 12 may convert a digital electrical signal containing data desired to be transmitted into an analog electrical signal using a transceiver. The analog electrical signal may then be amplified using a power amplifier, filtered using a filter, and transmitted using an antenna. In other words, the techniques described herein may be applicable to any suitable radio frequency system 12 that operates in any suitable manner regardless of communication protocol used.

Figure 2:
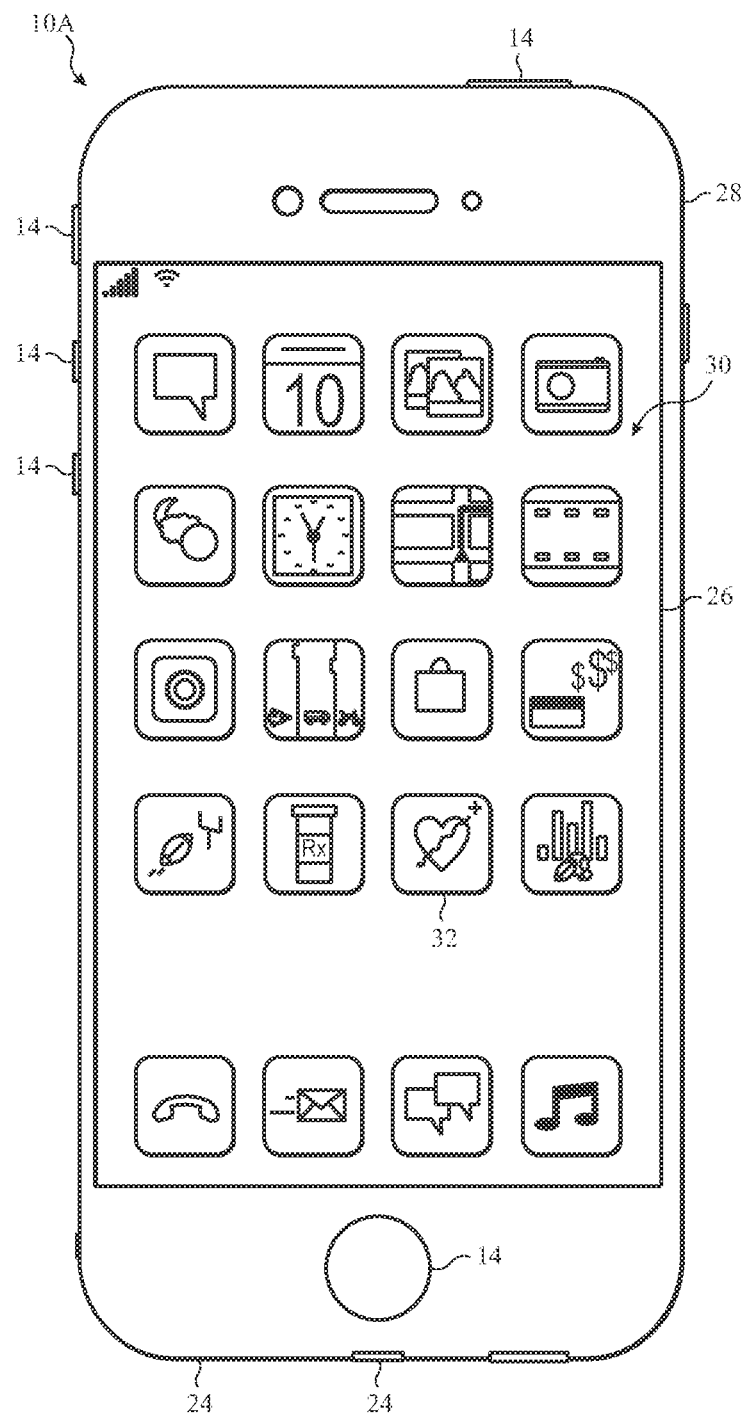
FIG. 2 is an example of the electronic device of FIG. 1, in accordance with an embodiment.

As described above, the electronic device 10 may be any suitable electronic device. To help illustrate, one example of a handheld device 10A is described in FIG. 2, which may be a portable phone, a media player, a personal data organizer, a handheld game platform, or any combination of such devices. For example, the handheld device 10A may be a smart phone, such as any iPhone® model available from Apple Inc. As depicted, the handheld device 10A includes an enclosure 28, which may protect interior components from physical damage and to shield them from electromagnetic interference. The enclosure 28 may surround the electronic display 26, which, in the depicted embodiment, displays a graphical user interface (GUI) 30 having an array of icons 32. By way of example, when an icon 32 is selected either by an input structure 14 or a touch sensing component of the electronic display 26, an application program may launch.

Additionally, as depicted, input structures 14 may open through the enclosure (e.g., housing) 28. As described above, the input structures 14 may enable a user to interact with the handheld device 10A. For example, the input structures 14 may activate or deactivate the handheld device 10A, navigate a user interface to a home screen, navigate a user interface to a user-configurable application screen, activate a voice-recognition feature, provide volume control, and toggle between vibrate and ring modes. Furthermore, as depicted, the I/O ports 24 open through the enclosure 28. In some embodiments, the I/O ports 24 may include, for example, an audio jack to connect to external devices. Additionally, the radio frequency system 12 may also be enclosed within the enclosure 28 and internal to the handheld device 10A.

Figure 3:
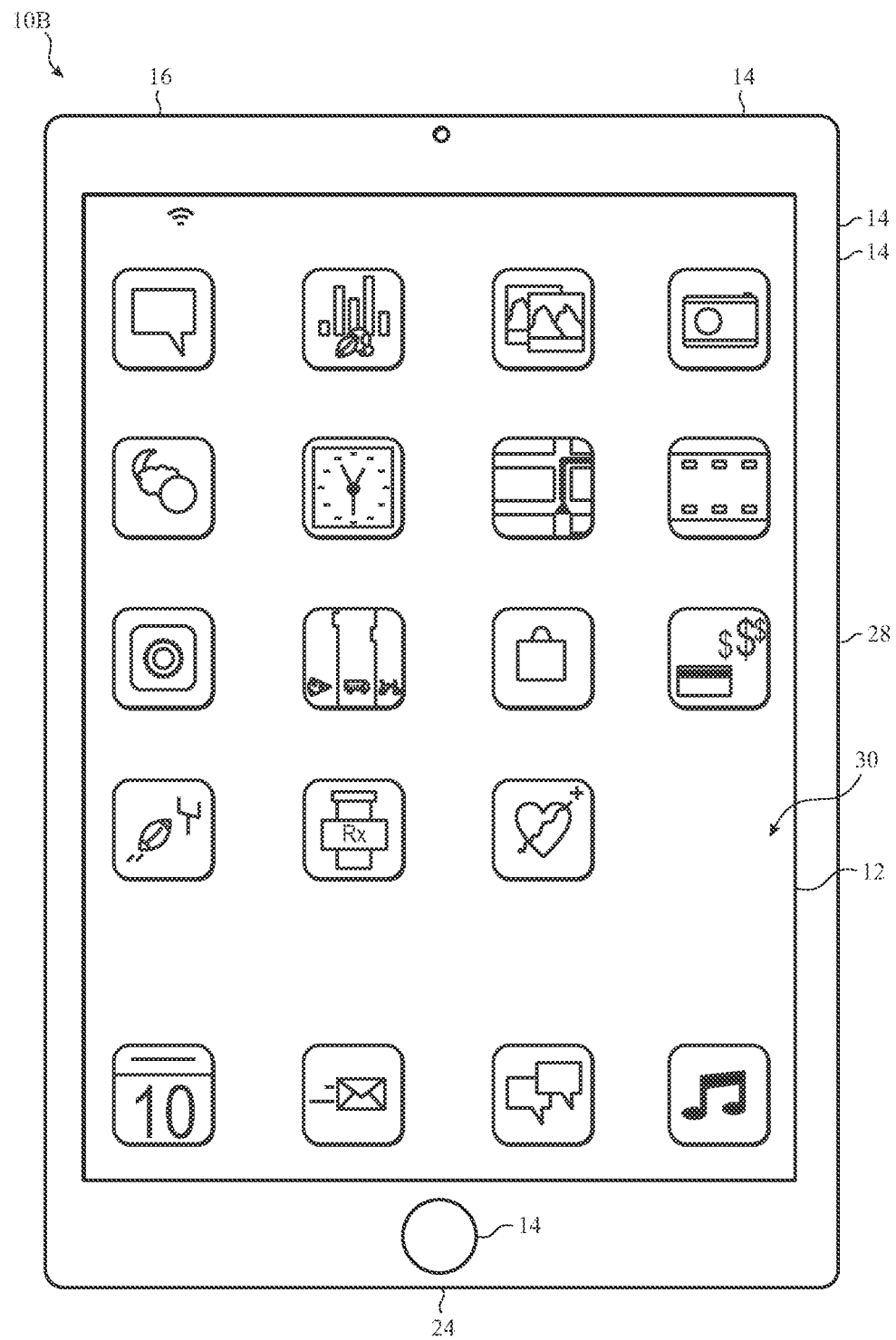
FIG. 3 is an example of the electronic device of FIG. 1, in accordance with an embodiment.
Figure 4:
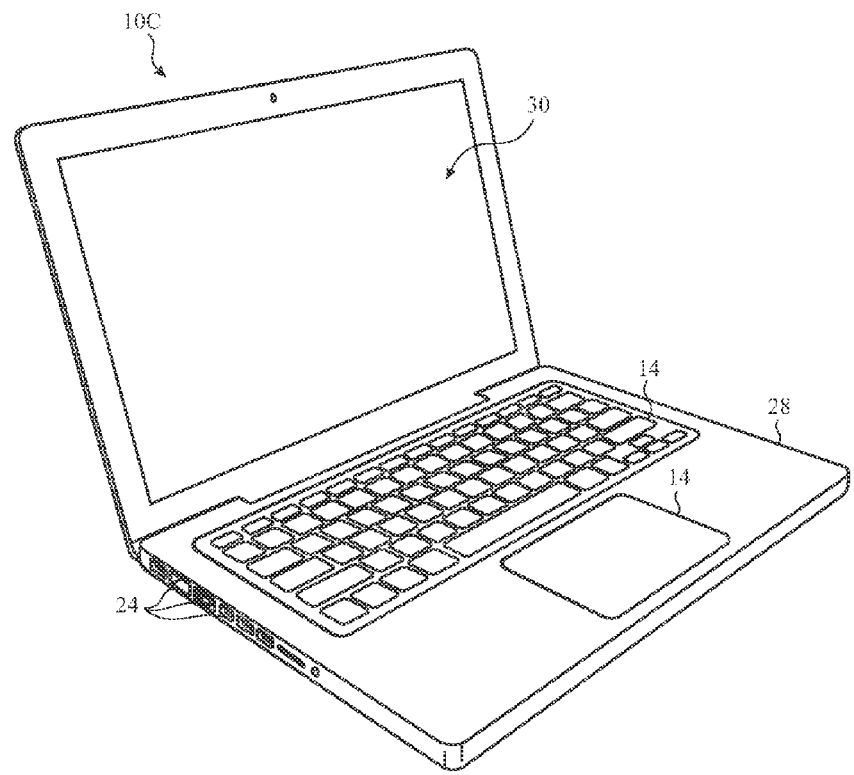
FIG. 4 is an example of the electronic device of FIG. 1, in accordance with an embodiment.

To further illustrate a suitable electronic device 10, a tablet device 10B is described in FIG. 3, such as any iPad® model available from Apple Inc. Additionally, in other embodiments, the electronic device 10 may take the form of a computer 10C as described in FIG. 4, such as any Macbook® or iMac® model available from Apple Inc. As depicted, the tablet device 10B and the computer 10C also include an electronic display 26, input structures 14, I/O ports 24, and an enclosure 28. Similar to the handheld device 10A, the radio frequency system 12 may also be enclosed within the enclosure 28 and internal to the tablet device 10B and/or the computer 10C.

Figure 5:
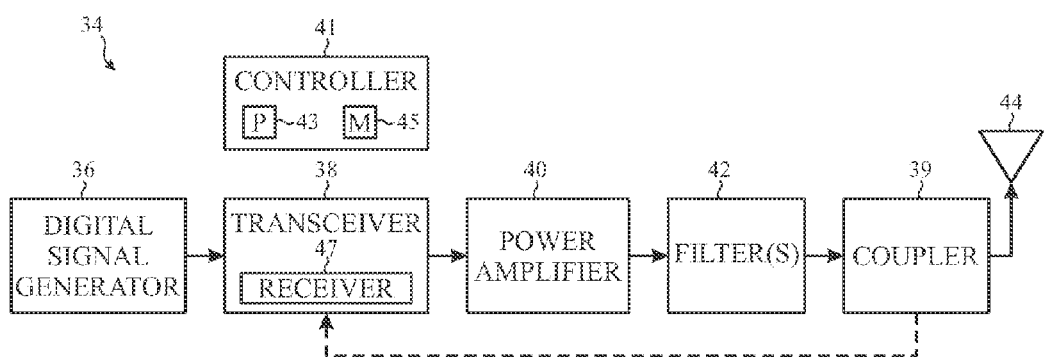
FIG. 5 is block diagram of a portion of the radio frequency system of FIG. 1, in accordance with an embodiment.

As described above, the radio frequency system 12 may facilitate communication with other electronic devices and/or a network by wirelessly communicating data. To help illustrate, a portion 34 of radio frequency system 12 is described in FIG. 5. As depicted, the portion 34 includes a digital signal generator 36, a transceiver 38, a power amplifier 40, one or more filters 42, a feedback coupler 39, an antenna 44, and a controller 41. More specifically, the controller 41 may include one or more processor 43 and memory 45 to facilitate controlling operation of the radio frequency system 12. For example, the controller 41 may instruct the transceiver 38, the power amplifier 40, the one or more filters, the coupler 39, or any combination thereof to adjust operational parameters. Accordingly, in some embodiments, the controller processor 43 may be included in the processor 18 and/or separate processing circuitry and the memory 45 may be included in memory 16 and/or a separate tangible non-transitory computer-readable medium.

Additionally, the digital signal generator 36 may generate a digital representation of data desired to be transmitted from the electronic device 10 by outputting a digital electrical signal. Accordingly, in some embodiments, the digital signal generator 36 may include the processor 18 and/or a separate processing circuitry, such as a baseband processor or a modem in the radio frequency system 12.

The transceiver 38 may then receive the digital electrical signal and generate an analog representation of the data. In some embodiments, the transceiver 38 uses digital signal modulation to generate an analog representation as an analog electrical signal. For example, when the digital electrical signal is high (e.g., "1"), the transceiver 38 may output an analog electrical signal with a positive voltage and, when the digital electrical signal is low (e.g., "0"), the transceiver 38 may output an analog electrical signal at zero volts. However, digital signal modulation used in the transceiver 38 may generally introduce some noise into the analog electrical signal.

Since the output power of the analog electrical signal may be small, the power amplifier 40 may receive and amplify the analog electrical signal by outputting an amplified analog electrical signal. More specifically, the power amplifier 40 may vary amplitude of the amplified analog electrical signal to enable the output power of the radio frequency system 12 to be adjusted. In fact, in some embodiments, the power amplifier 40 may mix noise/distortions introduced by the transceiver 38, thereby introducing intermodulation spurious emissions.

Additionally, in some embodiments, the power amplifier 40 may include one or more transistors as electrical switches to amplify the analog electrical signal. Ideally, the power amplifier 40 should linearly adjust amplitude (e.g., output power) of the amplified analog electrical signals and maintain a constant phase shift between the input analog electrical signals and the output amplified analog electrical signals. However, transistors are generally not ideal (e.g., parasitic capacitance, memory effects, and/or a non-linear input to output transfer function), which may affect linearity and/or phase shift of the power amplifier 40. For example, if amplitude modulation (AM) peaks exceed the drive capability of the power amplifier 40, the power amplifier compression may result, thereby causing AM-AM (amplitude modulation to amplitude modulation) and/or AM-PM (amplitude modulation to phase modulation) distortion. This distortion may result in impairments, such as error vector magnitude (EVM), on the in-band portion of the transmitted analog electrical signal (e.g., at the desired transmission frequency), thereby degrading signal integrity. In other words, the effects on linearity and/or phase shift in the power amplifier 40 may generally introduce noise or distortion into the amplified analog electrical signal.

To facilitate reducing noise introduced by the transceiver 38 and/or the power amplifier 40, one or more filters 42 may receive the amplified analog electrical signal and output a filtered analog electrical signal. More specifically, the one or more filters 42 may be tuned to attenuate portions of the amplified analog electrical signal at target frequencies, such as protected frequencies. However, since filters are generally not ideal, the one or more filters 42 may include a transition band that affects frequencies other than the target frequencies. In fact, when attenuating frequencies near the transmission frequency, the transition band may reduce the amplitude at the transmission frequency, thereby reducing output power of the radio frequency system 12.

The filtered analog electrical signal may then be wirelessly transmitted to another electronic devices and/or a network via the antenna 44 at a transmission frequency as modulated radio waves. The transmitted analog electrical signal may also be fed back from the coupler 39 to a feedback receiver 47, which may be used to facilitate controlling output power of the radio frequency system 12. In some embodiments, the feedback receiver 47 may by tuned to the portion of the transmitted analog electrical signal at the transmission frequency and surrounding frequencies (e.g., frequencies in adjacent channels). Additionally or alternatively, the feedback receiver 47 may be tuned to portions of the transmitted analog electrical signal at particular target frequencies (e.g., protected frequencies). In this manner, as will be described in more detail below, the feedback of the transmitted analog electrical signal may also facilitate determining location (e.g., frequency) and/or magnitude of spurious emissions.

As described above, noise or distortion introduced by the radio frequency system 12 may result in spurious emissions at frequencies other than the desired transmission frequency. To help illustrate, examples of analog electrical signals 46 are described in FIGS. 6A and 6B. More specifically, FIG. 6A describes a first analog electrical signal 46A that is transmitted when the radio frequency system 12 is assigned fifty resource blocks (e.g., 10 MHz) and FIG. 6B describes a second electrical signal 46B that is transmitted when the radio frequency system 12 is assigned one resource block. In the depicted embodiments, the radio frequencies are divided into channels with a bandwidth of 10 MHz. As such, FIGS. 6A and 6B describe the magnitude of the analog electrical signals 46 in a first channel 48 between 675-685 MHz, a second channel 50 between 685-695 MHz, a third channel 52 between 695-705 MHz, a fourth channel 54 between 705-715 MHz, and a fifth channel 56 between 715-725 MHz. It should be noted that the analog electrical signals 46 are merely intended to be illustrative and not limiting.

Figure 6A:
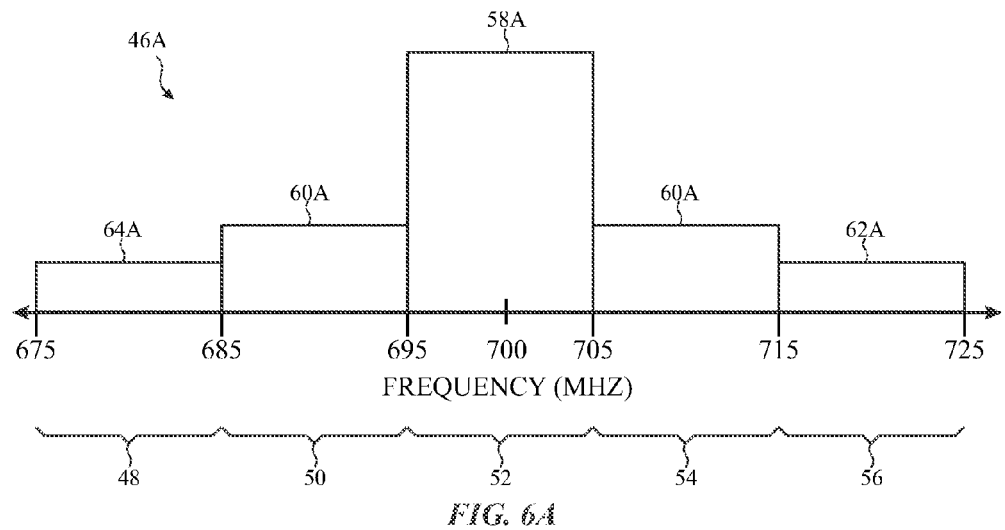
FIG. 6A is a plot of a first analog electrical signal transmitted by the radio frequency system of FIG. 5, in accordance with an embodiment.

With regard to FIG. 6A, since the radio frequency system 12 is assigned fifty resource blocks, the first analog electrical signal 46A has a desired transmission bandwidth of 10 MHz. Thus, as depicted, the analog electrical signal 46A includes a data portion 58A at the frequencies between 695-705 MHz. More specifically, the data portion 58A includes the analog representation of data desired to be wirelessly transmitted to another electronic device and/or a network.

However, the data portion 58A may also include noise or distortion introduced, for example, by the transceiver 38. As such, when the introduced noise or distortion is mixed in the power amplifier 40, intermodulation spurious emissions may result. Generally odd order intermodulation spurious emissions occur near the transmission frequency. More specifically, 3rd order intermodulation spurious emissions may occur in channels directly adjacent to the transmission channel, 5th order intermodulation spurious emissions may occur at channels two channels away from the transmission channel, 7th order intermodulation spurious emissions may occur at channels three channels away from the transmission channel, and so on. For example, in the depicted embodiment, 3rd order intermodulation spurious emissions 60A with a 10 MHz bandwidth occur in the second channel 50 and the fourth channel 54. Additionally, 5th order intermodulation spurious emissions 62A with a 10 MHz bandwidth occur in the first channel 48 and the fifth channel 56.

Figure 6B:
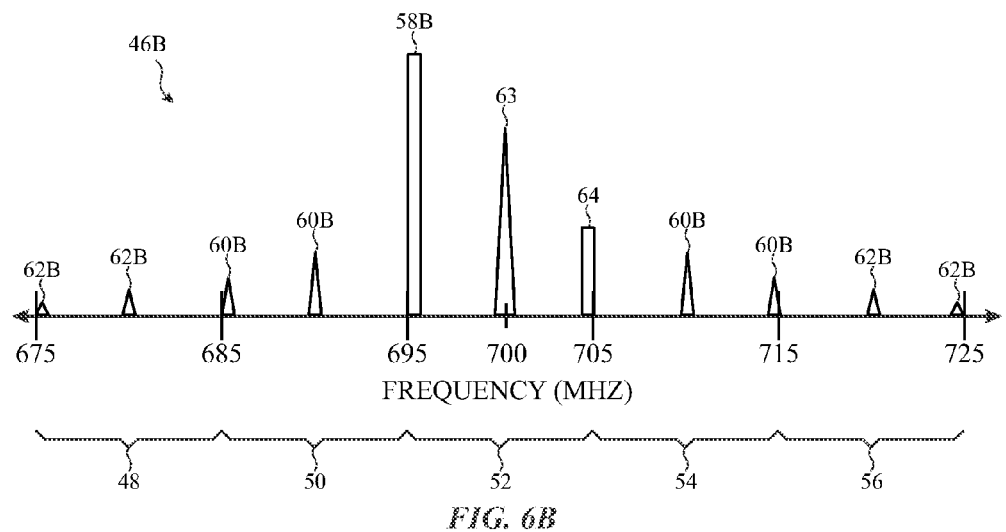
FIG. 6B is a plot of a first analog electrical signal transmitted by the radio frequency system of FIG. 5, in accordance with an embodiment.

With regard to FIG. 6B, since the radio frequency system 12 is assigned one resource block, the second analog electrical signal 46B has a desired transmission bandwidth of 0.2 MHz. In the depicted embodiment, the second analog electrical signal 46B includes a data portion 58B at frequencies around 695 MHz (e.g., edge of the third channel 52). More specifically, the data portion 58B includes the analog representation of data desired to be wirelessly transmitted to another electronic device and/or a network.

However, in addition to the data portion 58B, the analog electrical signal 46B also includes a local oscillator (LO) spurious emission 63 at frequencies around 700 MHz and an in-phase quadrature (IQ) spurious emission 64 at frequencies around 705 MHz. In some embodiments, the local oscillator spurious emission 63 may be introduced by the transceiver 38 at the central frequencies of the channel (e.g., 700 MHz) since the transceiver 38 is generally tuned to the central frequencies. Additionally, the in-phase quadrature spurious emission 64 may also be introduced by imperfections of the transceiver 38 and occur at frequencies such that the local oscillator spurious emission 63 is between and equidistant from the data portion 58B and the in-phase quadrature spurious emission 64.

Additionally, when the data portion 58B, the local oscillator spurious emissions 63, and the in-phase quadrature spurious emission 64 are mixed in the power amplifier 40, intermodulation spurious emissions may result. For example, in the depicted embodiment, 3rd order intermodulation spurious emissions 60B occur in the second channel 50 at frequencies around 690 MHz (e.g., as a result of intermodulation between the data portion 58B and local oscillator spurious emission 63) and at frequencies around 685 MHz (e.g., as a result of intermodulation between the data portion 58B and the in-phase quadrature spurious emission 64). Similarly, 3rd order intermodulation spurious emission 60B occur in the fourth channel 54 at frequencies around 710 MHz and 715 MHz. Additionally, 5th order intermodulation spurious emissions 62A occur in the first channel 48 at frequencies around 675 MHz and 680 MHz and in the fifth channel 56 at frequencies around 720 MHz and 725 MHz.

However, as described above, regulatory bodies may place acceptable limits on spurious emissions (e.g., intermodulation spurious emissions 60 and 62), particularly at protected/restricted frequency ranges. For example, the FCC limits spurious emissions at frequencies between 608-614 MHz to 200 microvolts/meter. Thus, continuing with the above examples, it is possible that transmitting the analog electrical signals 46 may result in a higher order (e.g., 19th order) intermodulation spurious emission occurring in between 608-614 MHz. Moreover, if the analog electrical signals 46 use a lower transmission frequency (e.g., 615 MHz), it may be possible that lower order intermodulation spurious emissions (e.g., 60 or 62) may occur between 608-614 MHz.

Figure 7:
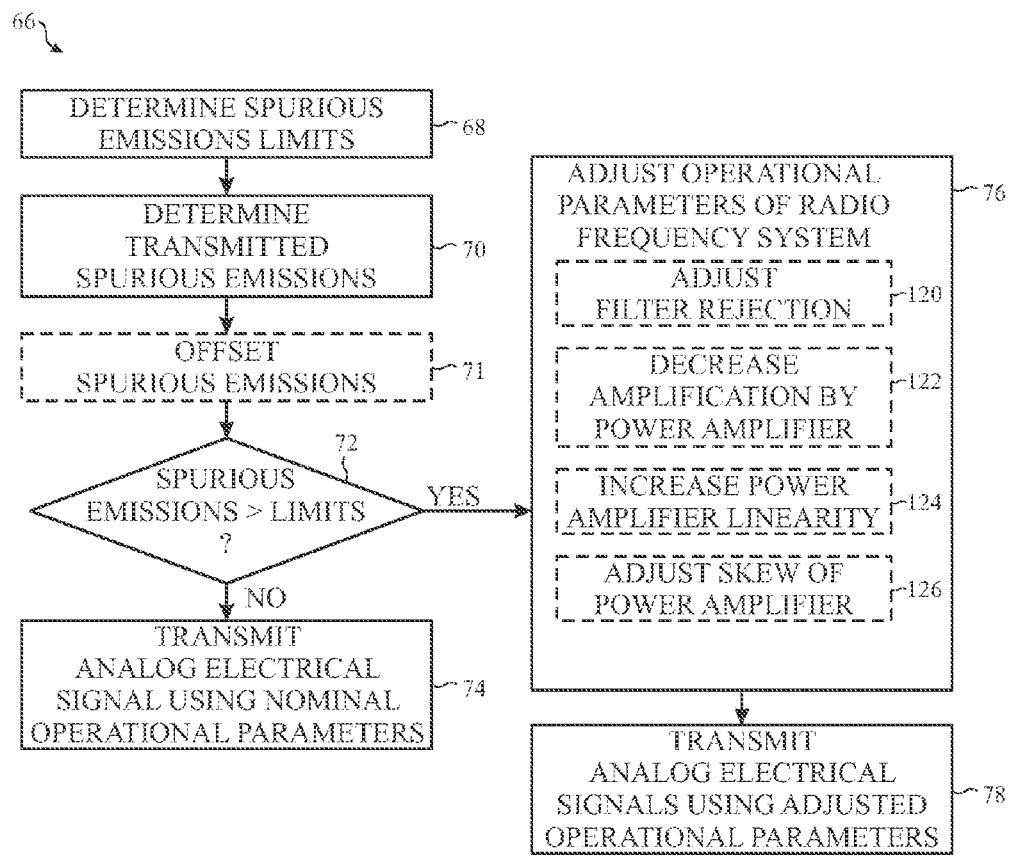
FIG. 7 is a flow diagram describing a process for transmitting analog electrical signals using the radio frequency system of FIG. 5, in accordance with an embodiment.

As such, the radio frequency system 12 may be operated such that spurious emissions meet set spurious emissions limits. To help illustrate, one embodiment of a process 66 for controlling operation of a radio frequency system 12 is described in FIG. 7. Generally, the process 66 includes determining spurious emissions limits (process block 68), determining transmitted spurious emissions (process block 70), determining whether spurious emissions are greater than the spurious emissions limits (decision block 72), and transmitting analog electrical signals using nominal operational parameters when the spurious emissions are not greater than the limits (process block 74). Additionally, when the spurious emissions are greater than the limits, the process 66 includes adjusting the operational parameters of the radio frequency system (process block 76) and transmitting the analog electrical signals using adjusted operational parameters (process block 78). Furthermore, the process 66 optionally includes offsetting the spurious emissions (process block 71). In some embodiments, the process 66 may be implemented using instructions stored in the memory 16, 45 and/or another suitable tangible non-transitory computer-readable medium and executable by the processor 18, 43, and/or another suitable processing circuitry.

Accordingly, the radio frequency system 12 may determine any set spurious emissions limits (process block 68). As described above, the spurious emissions limits regulating location (e.g., frequency) and/or magnitude of spurious emissions may be predetermined and set by regulatory bodies. Thus, in some embodiments, a manufacturer may store any such spurious emissions limits in memory (e.g., 16 or 45) upon manufacture. Thus, upon powering on, the radio frequency system 12 may poll the memory to determine spurious emissions limits. Additionally or alternatively, to facilitate operating under jurisdictions of various regulating bodies, the radio frequency system 12 may receive spurious emissions limits for a particular jurisdiction from a network upon powering up.

Additionally, the radio frequency system 12 may determine the location (e.g., frequency) and/or magnitude of spurious emissions transmitted (process block 70). As described above, the spurious emissions may vary based on operational parameters, such as ambient temperature, transmission frequency, output power, antenna load, and the like. Accordingly, in some embodiments, as will be described in more detail below, the radio frequency system 12 may determine the operational parameters and supply the operational parameters to a model, which relates the operational parameters to spurious emissions.

Figure 8:
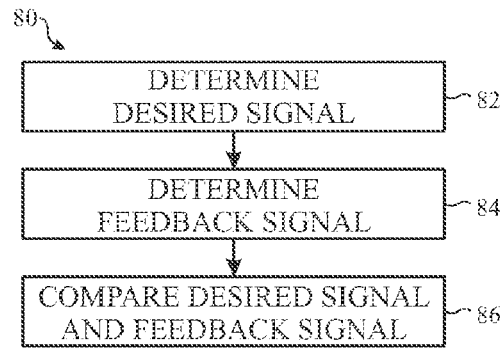
FIG. 8 is a flow diagram describing a process for determining spurious emissions based on a feedback signal, in accordance with an embodiment.

Additionally or alternatively, as described above, the radio frequency system 12 may determine the spurious emissions based at least in part on a feedback signal received from the coupler 39. To help illustrate, one embodiment of a process 80 for determining spurious emissions based on the feedback signal is described in FIG. 8. Generally, the process 80 includes determining a desired (e.g., ideal) signal (process block 82), determining a feedback signal (process block 84), and comparing the desired signal and the feedback signal (process block 86). In some embodiments, the process 80 may be implemented using instructions stored in the memory 16, 45 and/or another suitable tangible non-transitory computer-readable medium and executable by the processor 18, 43, and/or another suitable processing circuitry.

Accordingly, the radio frequency system 12 may determine the desired signal (process block 82). More specifically, the desired signal represents the data to be transmitted without any noise or distortion. As such, the desired signal may be the digital electrical signal received from the digital signal generator 36 because the digital electrical signal does not include noise or distortion introduced by the transceiver 38 and/or the power amplifier 40.

Additionally, the radio frequency system 12, and more particularly the feedback receiver 47, may determine the feedback signal from the coupler 39 (process block 84). As described above, the feedback receiver 47 may determine portions of the transmitted analog electrical signal at frequencies surrounding the transmission frequency to facilitate controlling output power of the radio frequency system 12. Accordingly, in some embodiments, the feedback receiver 47 may be shared and tuned to the portion of the transmitted analog electrical signal at frequencies surrounding the transmissions frequency. Additionally or alternatively, the feedback receiver 47 may be dedicated and tuned to portions of the transmitted analog electrical signal at specific frequencies.

In either embodiment, the radio frequency system 12 may determine location (e.g., frequency) and/or magnitude by comparing the desired signal with the feedback signal (process block 88). More specifically, the radio frequency system 12 may determine location of spurious emissions based on frequencies at which the desired signal and the feedback signal differ. Additionally, the radio frequency system 12 may determine magnitude of the spurious emission based on difference between the desired signal and the feedback signal at those locations.

Figure 9:
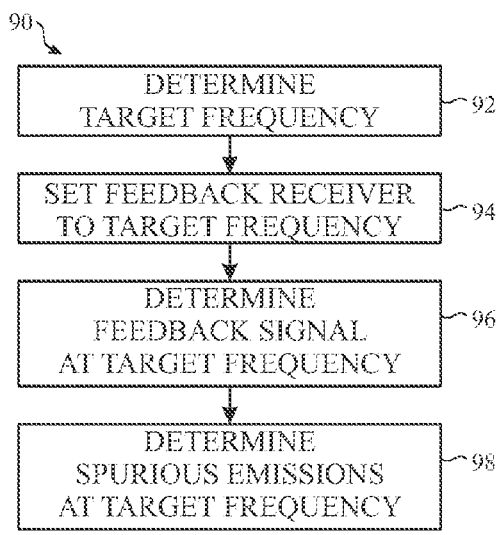
FIG. 9 is a flow diagram describing a process for determining spurious emissions using a dedicated coupler, in accordance with an embodiment.

To help illustrate, one embodiment of a process 90 for determining spurious emissions using a dedicated feedback receiver 47 is described in FIG. 9. Generally, the process 90 includes determining a target frequency (process block 92), setting a feedback receiver to the target frequency (process block 94), determining feedback signal at the target frequency (process block 96), and determining spurious emissions at the target frequency (process block 98). In some embodiments, the process 90 may be implemented using instructions stored in the memory 16, 45 and/or another suitable tangible non-transitory computer-readable medium and executable by the processor 18, 43, and/or another suitable processing circuitry.

Accordingly, the radio frequency system 12 may determine the target frequency (process block 92) and set the feedback receiver 47 accordingly (process block 94). In some embodiments, the target frequency may be set to protected/restricted frequencies that are likely to contain spurious emissions above a set limit. The feedback receiver 47 may then be tuned to determine portions of the analog electrical signal 46 at the target frequency and possibly surrounding frequencies.

In this manner, the radio frequency system 12 may determine any spurious emissions at the target frequency by comparing the desired signal at the target frequency and the feedback signal at the target frequency (process block 98). More specifically, the radio frequency system 12 may determine that spurious emissions occur at the target frequency when the desired signal and the feedback signal differ. Additionally, the radio frequency system 12 may determine magnitude of the spurious emissions at the target frequency based on amount of difference between the desired signal and the feedback signal at the target frequency.

In other words, the use of a dedicated feedback receiver 47 enables explicitly determining location and/or magnitude of spurious emissions at one or more target frequencies. However, to reduce components and/or cost of the radio frequency system 12, a shared feedback receiver 47 may still be used to determine location and/or magnitude by calculating spurious emissions based on feedback of the portion of the transmitted analog electrical signal at frequencies surrounding the transmission frequency (e.g., transmission channel and adjacent channels).

Figure 10:
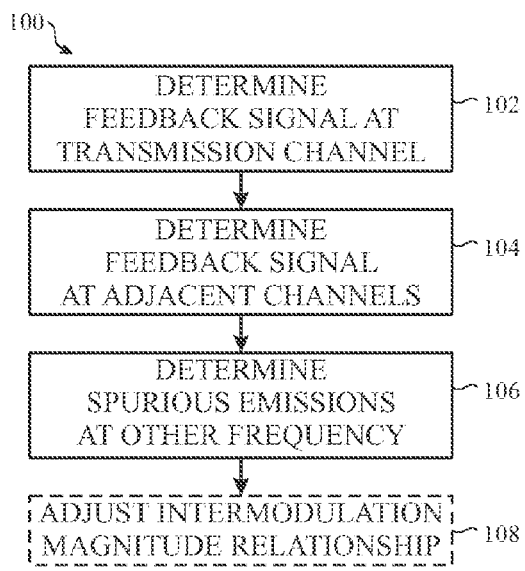
FIG. 10 is a flow diagram describing a process for determining spurious emissions using a shared coupler, in accordance with an embodiment.

To help illustrate, one embodiment of a process 100 for determining spurious emissions using a shared feedback receiver 47 is described in FIG. 10. Generally, the process 100 includes determining feedback signal at a transmission channel (process block 102), determining feedback signal at adjacent channels (process block 104), and determining spurious emissions at other frequencies (process block 106). Additionally, process 100 may optionally include adjusting a relationship between the intermodulation spurious emissions (process block 108). In some embodiments, the process 100 may be implemented using instructions stored in the memory 16, 45 and/or another suitable tangible non-transitory computer-readable medium and executable by the processor 18, 43, and/or another suitable processing circuitry.

As described above, a shared feedback receiver 47 may be used to facilitate controlling output power by determining the portion of the transmitted analog electrical signal at the transmission frequency. Since the feedback receiver 47 may have a bandwidth of multiple channels, the feedback signal may include the portion of the transmitted analog electrical signal in the transmission channel, which includes the transmission frequency (process block 102), as well as the portion of the transmitted analog electrical signal in channels adjacent to the transmission channel (process block 104). As such, the radio frequency system 12 may explicitly determine location and/or magnitude of spurious emissions in the transmission channel and the adjacent channels by comparing the feedback signal with the desired signal.

More specifically, lower order intermodulation spurious emissions (e.g., 60 and/or 62) generally occur in frequencies surrounding the transmission frequency and, thus, may be explicitly determined. However, since higher order intermodulation spurious emissions may occur multiple channels away, they may be outside of the feedback receiver 47 bandwidth. Nevertheless, the radio frequency system 12 may still determine (e.g., infer) location and/or magnitude of such intermodulation spurious emissions based on the signal integrity of the in-band feedback signal.

As discussed above, an odd order intermodulation emission (e.g., 60 or 62) generally occurs at each channel on either side of the transmission channel. As such, the radio frequency system 12 may determine the location (e.g., channel) of the intermodulation spurious emissions based at least in part on this relationship. For example, as discussed in FIGS. 6A and 6B, since the transmission channel is the third channel 52, the 3rd order intermodulation spurious emissions 60 occur in the second channel 50 and the fourth channel 54 and the 5th order intermodulation spurious emissions 62 occur in the first channel 48 and the fifth channel 56.

Additionally, the magnitudes of the odd order intermodulation spurious emissions are generally related. For example, in some embodiments, magnitudes of the odd order intermodulation spurious emissions may be related such that magnitude of the 3rd order intermodulation spurious emission has a 3:1 ratio, magnitude of the 5th order intermodulation spurious emission has a 5:1 ratio, magnitude of the 7th order intermodulation spurious emission has a 7:1 ratio, and so on. Accordingly, since the 3rd intermodulation spurious emission 60 and/or the 5th intermodulation spurious emission 62 generally occurs in an adjacent channels and are fed back, the radio frequency system 12 may determine the magnitude of the higher order intermodulation spurious emissions based on the relationship between the magnitudes.

In some embodiments, the relationship between the magnitudes of the odd order intermodulation spurious emissions may be predetermined by a manufacturer and stored in memory (e.g., 16 or 45) as a look-up-table (LUT) or a model. Moreover, since spurious emissions may vary based on operational parameters, the relationship between magnitudes of the odd order intermodulation spurious emissions may be updated over the course of operation of the radio frequency system 12 (process block 108). For example, if the feedback receiver 47 has bandwidth capable of measuring multiple odd order intermodulation spurious emissions, the radio frequency system 12 may determine whether the measured magnitudes are consistent with the determined relationship and adjust the relationship (e.g., model or LUT) accordingly.

Figure 11:
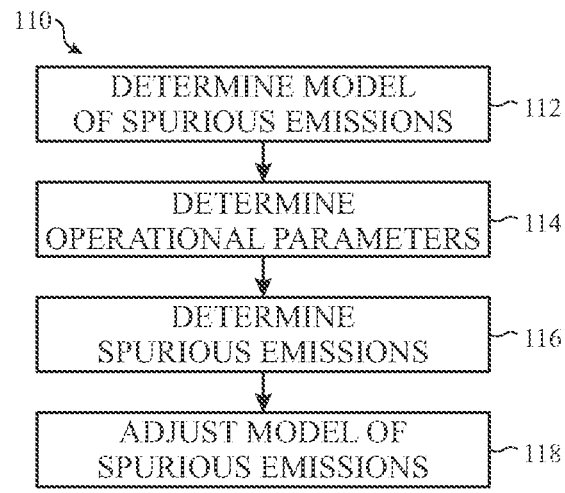
FIG. 11 is a flow diagram describing a process for determining spurious emissions based on a model, in accordance with an embodiment.

Additionally, since the spurious emissions may vary based on operational parameters, a model describing relationship between spurious emissions and various operational parameters may be used to determine spurious emissions. To help illustrate, one embodiment of a process 110 for determining spurious emissions using a model is described in FIG. 11. Generally, the process 110 includes determining a model of spurious emissions (process block 112), determining operational parameters (process block 114), and determining spurious emissions (process block 116). Additionally, the process 110 optionally includes adjusting the model of spurious emissions (process block 118). In some embodiments, the process 110 may be implemented using instructions stored in the memory 16, 45 and/or another suitable tangible non-transitory computer-readable medium and executable by the processor 18, 43, and/or another suitable processing circuitry.

Accordingly, the radio frequency system 12 may determine the model describing relationship between spurious emissions and operational parameters (process block 112). In some embodiments, the model may be determined by a manufacturer and stored in memory (e.g., 16 or 45). More specifically, the manufacturer may run a testing or training sequence to determine how sets of operational parameters affect spurious emissions. For example, the manufacturer may determine the location and magnitude of spurious emissions at varying ambient temperatures, transmission frequencies, output powers, and antenna loads.

The radio frequency system 12 may then determine the operational parameters that are inputs to the model (process block 114). In some embodiments, this may include polling various sensors (e.g., temperature sensors) and/or the memory to determine various operational parameters. For example, the radio frequency system 12 may poll a temperature sensor to determine ambient temperature. Additionally, the radio frequency system 12 may poll memory to determine a desired transmission frequency, a desired output power, current antenna load, or any combination thereof.

In this manner, the radio frequency system 12 may determine location and/or magnitude of spurious emissions by inputting the operational parameters into the model (process block 116). Moreover, since the radio frequency system 12 may still include a shared feedback receiver 47 to facilitate controlling output power, the radio frequency system 12 may determine portions of the transmitted analog electrical signal at the transmission channel and adjacent channels, thereby enabling the radio frequency system 12 to determine spurious emissions in the transmission channel and adjacent channels. As such, the radio frequency system 12 may determine whether the measured magnitudes are consistent with the model and adjust the model accordingly.

Returning to FIG. 7, once the spurious emissions are determined, the radio frequency system 12 may optionally offset the spurious emissions (process block 71). As described above, the spurious emissions may be a result of noise introduced by the transceiver 38 and/or the power amplifier 40. Accordingly, to offset the spurious emissions, the transceiver 38 may generate the analog electrical signal such that it includes an inverse of the noise introduced by the transceiver 38 and/or the power amplifier 40. In this manner, the noise introduced by the transceiver 38 and/or the power amplifier 40 may be canceled out, thereby reducing spurious emissions.

Additionally, the radio frequency system 12 may determine whether the spurious emissions are greater than set limits (decision block 72). When not greater than the limits, the radio frequency system may transmit the analog electrical signals using nominal operational parameters (process block 74). More specifically, the nominal operational parameters may be a set of operational parameters that balance ability of the radio frequency system 12 to meet spurious emissions limits, efficiency (e.g., output power/DC power consumption), and reliability of transmission.

On the other hand, when greater than the limits, the radio frequency may adjust the operational parameters away from the nominal operational parameters to reduce spurious emissions below the limits (process block 76). For example, adjusting the operational parameters may include adjusting filter rejection (process block 120), decreasing amplification by the power amplifier (process block 122), increasing power amplifier linearity (process block 124), adjusting skew of power amplifier (process block 126), or any combination thereof.

In some embodiments, the radio frequency system 12 may adjust the one or more filters 42 to control frequencies targeted by the filters 42 and/or aggressiveness of the filtering (process block 120). More specifically, the radio frequency system 12 may tune the filters 42 to target particular frequencies at which to reduce spurious emissions. As such, the filters 42 may be tuned to particular frequencies where spurious emissions are exceeding limits. Additionally, the aggressiveness the filters 42 may be adjusted to control amount the spurious emissions are attenuated (e.g., reduced) at the target frequencies.

However, as described above, the filters 42 generally include a transition band and, thus, may affect frequencies other than the target frequencies. For example, when the filters 42 are tuned to a frequency near the transmission frequency, the transition band of the filters 42 may also attenuate the transmitted analog electrical signal at the transmissions frequency. Moreover, as the aggressiveness increases, the frequencies affected by the transition band may increase as well as the magnitude of the attenuation at the affected frequencies.

In other words, the tuning and/or aggressiveness of the filters 42 may affect the output power of the transmitted analog electrical signals. To compensate, the radio frequency system 12 may increase the amplification by the power amplifier 40. However, increasing amplification may consume a greater amount of electrical power to achieve the same output power, thereby decreasing efficiency (e.g., output power/DC power consumption) of the radio frequency system 12. In fact, to improve efficiency, under nominal operational parameters, the radio frequency system 12 may utilize less aggressive filtering or even bypass the filters 42 entirely. As such, adjusting the filter rejection away from the nominal operational parameters may affect performance of the radio frequency system 12, for example, by decreasing output power and/or decreasing efficiency.

Additionally, in some embodiments, the radio frequency system 12 may decrease amplification by the power amplifier 40 to reduce magnitude of spurious emissions over the spectrum of the transmitted analog electrical signals (process block 122). More specifically, the magnitude of intermodulation spurious emissions (e.g., 60 or 62) may be directly related to the output power of the transmitted analog electrical signal. In other words, by decreasing output power of the transmitted analog electrical signal as a whole via reduction in amplification by the power amplifier 40, the magnitude of the spurious emissions may also be decreased.

However, reducing output power of the radio frequency system 12 may affect reliability of communication with the other electronic device and/or the network. For example, a lower output power may increase the risk of data packets being dropped. In some embodiments, this may cause the radio frequency system 12 to resend the dropped data packets, which consumes additional electrical power, or simply proceed without the dropped packets, which may affect communication (e.g., call) quality. In fact, under nominal operational parameters, the radio frequency system 12 may utilize amplification in the power amplifier 40 that balances efficiency and communication reliability. As such, adjusting amplification away from the nominal operational parameters may affect performance of the radio frequency system 12, for example, by decreasing efficiency and/or decreasing communication reliability.

Furthermore, in some embodiments, the radio frequency system 12 may increase linearity of the power amplifier 40 to reduce noise introduced by the power amplifier 40 (process block 124). As described above, the power amplifier 40 may introduce noise due to a non-linear relationship between amplitude of the input and output analog electrical signals and/or an inconsistent phase shift between the input and output analog electrical signals, which vary based on output power. Thus, improving linearity of the power amplifier 40 may decrease amount of noise introduced, thereby reducing spurious emissions.

Generally, linearity may be improved by increasing electrical power supplied to the power amplifier 40. As such, increasing linearity to achieve the same output power may decrease efficiency (e.g., output power/DC power consumption) of the radio frequency system 12. In fact, under nominal operational parameters, the radio frequency system 12 may utilize a linearity of the power amplifier 40 that balances efficiency and introduced noise. As such, adjusting amplification away from the nominal operational parameters may affect performance of the radio frequency system 12, for example, by decreasing efficiency.

Moreover, in some embodiments, the radio frequency system 12 may adjust the skew of the power amplifier 40 to adjust location (e.g., frequency) of the spurious emissions (process block 126). For example, when the power amplifier 40 utilizes envelope tracking, the skew of the power amplifier 40 may be adjusted to shift spurious emissions from one side of the transmission frequency to the other. In other words, spurious emissions at some frequencies may be improved at the expense of others. This may be particularly useful when protected/restricted frequencies occur closer on one side of the transmission frequency.

However, since the location of protected/restricted frequencies may vary based on jurisdiction, under nominal operational parameters, the radio frequency system 12 may utilize a skew that evenly spreads the spurious emissions on either side of the transmission frequency. As such, adjusting skew of the power amplifier 40 away from the nominal operational parameters may affect performance of the radio frequency system 12, for example, by introducing spurious emissions at other frequencies.

Once the operational parameters of the radio frequency system 12 are adjusted using any combination of the techniques described above, the radio frequency system 12 may transmit subsequent analog electrical signals using the adjusted operational parameters while meeting any spurious emissions limits (process block 78). As described above, each of the techniques that may be employed to adjust the operational parameters introduce different tradeoffs. Accordingly, it may be desirable to employ techniques based at least in part on type, location, magnitude, and/or number of the spurious emissions.

Figure 12:
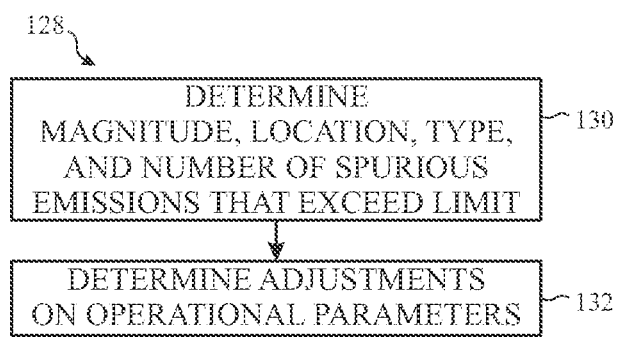
FIG. 12 is a flow diagram describing a process for determining adjustments to operational parameters of the radio frequency system of FIG. 5, in accordance with an embodiment.

To help illustrate, one embodiment of a process 128 for determining the adjustments to the operational parameters is described in FIG. 12. Generally, the process 128 includes determining magnitude, location, number, and type of spurious emissions that exceed limits (process block 130) and determining adjustments on operational parameters (process block 132). In some embodiments, the process 128 may be implemented using instructions stored in the memory 16, 45 and/or another suitable tangible non-transitory computer-readable medium and executable by the processor 18, 43, and/or another suitable processing circuitry.

Accordingly, as described above, the radio frequency system 12 may determine magnitude and location of spurious emissions, for example, using a feedback signal and/or a model of spurious emissions. Additionally, the radio frequency system 12 may determine number of spurious emissions based at least in part on number of instances the feedback signal differs from a desired signal. Furthermore, the radio frequency system 12 may determine the type of each spurious emission based on location of the spurious emission. For example, when the spurious emissions are in set intervals from the transmission channel, the radio frequency system 12 may determine that the spurious emissions are intermodulation spurious emissions (e.g., 60 or 62). Spurious emissions at integer multiples of the desired transmission frequency may be identified as harmonics. Emissions type and location may also be known to the controller 41 in advance based on the type of signal being transmitted.

Based at least in part on the magnitude, location, type, and number of the spurious emissions, the radio frequency system 12 may then determine what techniques to employ when adjusting the operational parameters (process block 132). For example, when spurious emissions exceed limits at a large number of frequencies, the radio frequency system 12 may determine that reducing amplification by the power amplifier 40 should be used to enable decreasing spurious emissions across the spectrum of the transmitted analog electrical signal. Additionally, when power consumption is not a concern (e.g., when electronic device 10 connected to a wall outlet), the radio frequency system 12 utilize adjusting filter rejection and/or increasing power amplifier 40 linearity. Furthermore, when intermodulation spurious emissions exceed limits, the radio frequency system 12 may determine to increase power amplifier 40 linearity to reduce noise introduced by the power amplifier 40 that cause the intermodulation spurious emissions (e.g., 60 or 62). Moreover, when spurious emission (e.g., 60 or 62) exceed limits on one side of the transmission frequency but not the other, the radio frequency system 12 may determine to adjust skew of the power amplifier 40 to shift location of leakage spurious emissions.

Accordingly, the technical effects of the present disclosure include improving performance of a radio frequency system by adjusting operation based at least in part on spurious emissions. More specifically, the radio frequency system may predominantly operate using nominal operational parameters, which may strike a balance between efficiency (e.g., output power/DC power consumption) and reliability. However, since occurrence of spurious emissions may vary over operation, the radio frequency system may adjust the operational parameters away from the nominal operational parameters so that spurious emissions limits are not exceeded. In this manner, the nominal operational parameters may be set more aggressively, thereby improving efficiency and/or reliability, since the operational parameters may be dynamically adjusted when spurious emissions exceed set limits.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A radio frequency system comprising:
    a transceiver configured to generate a first analog electrical signal based at least in part on a digital electrical signal using digital signal modulation, wherein the digital signal modulation introduces a first noise in the first analog electrical signal;
    a power amplifier configured to generate a second analog electrical signal by amplifying the first analog electrical signal, wherein the power amplifier introduces a second noise in the second analog electrical signal;
    an antenna configured to wirelessly transmit analog electrical signals at a desired transmission frequency;
    a feedback receiver configured to determine a feedback signal comprising a portion of a transmitted analog electrical signal via a coupler; and
    a controller configured to:
        determine location and magnitude of a spurious emission transmitted at a frequency other than the desired transmission frequency by comparing the feedback signal with a desired signal, wherein the desired signal comprises the digital electrical signal and does not contain noise introduced by the radio frequency system, the noise introduced by the radio frequency system comprises the first noise and the second noise, and the first noise and the second noise are configured to produce the spurious emission in the transmitted analog electrical signal; and
        instruct the radio frequency system to adjust operational parameters used to transmit the analog electrical signals when the magnitude of the spurious emission exceeds a spurious emissions limit at the location.

2. The radio frequency system of claim 1, wherein the controller is configured to instruct the radio frequency system to use nominal operational parameters to transmit the analog electrical signals when the magnitude of the spurious emission does not exceed the spurious emissions limit at the location.

3. The radio frequency system of claim 2, wherein adjusting the operational parameters away from the nominal operational parameters reduces output power of the radio frequency system, efficiency of the radio frequency system, reliability of the radio frequency system, or any combination thereof.

4. The radio frequency system of claim 1, wherein the controller is configured to instruct the radio frequency system to the adjust operational parameters by adjusting filter rejection, decreasing amplification by the power amplifier, increasing linearity of the power amplifier, adjusting skew of the power amplifier, or any combination thereof.

5. The radio frequency system of claim 1, wherein the controller is configured to instruct the transceiver to generate the analog electrical signals such that the analog electrical signals include an inverse of the noise introduced by the radio frequency system.

6. The radio frequency system of claim 1, wherein the feedback receiver is configured to determine the feedback signal such that the feedback signal comprises the portion of the transmitted analog electrical signal at the desired transmission frequency;
    wherein the controller is configured to control output power of the radio frequency system based at least in part on the feedback signal.

7. The radio frequency system of claim 1, wherein the coupler is configured to determine the feedback signal such that the feedback signal comprises the portion of the transmitted analog electrical signal at a protected or restricted frequency.

8. A method, comprising:
    determining, using a controller in a radio frequency system, magnitude and location of a plurality of spurious emissions in a transmitted analog electrical signal;
    determining, using the controller, number of spurious emissions in the plurality of spurious emissions;
    determining, using the controller, type of each of the plurality of spurious emissions based at least in part on location of each of the plurality of spurious emissions; and
    determining, using the controller, operational parameters used to transmit subsequent analog electrical signals by determining whether to adjust filter rejection of a filter, decrease amplification by a power amplifier, increase linearity of the power amplifier, adjust skew of the power amplifier, or any combination thereof based at least in part on number of spurious emissions in the plurality of spurious emissions and type, magnitude, and location of each of the plurality of spurious emissions, wherein:

adjusting the filter rejection comprises tuning the filter to the location of one or more of the plurality of spurious emissions and adjusting aggressiveness of the filter to attenuate the subsequent analog electrical signals less than a set spurious emissions limit;

decreasing the amplification by the power amplifier comprises reducing output power used to transmit the subsequent analog electrical signals;

increasing the linearity of the power amplifier comprises increasing electrical power supplied to the power amplifier; and adjusting the skew of the power amplifier comprises shifting one or more of the plurality of spurious emissions from a first frequency to a second frequency.

9. The method of claim 8, wherein determining magnitude, location, number, and type of the plurality of spurious emissions comprises comparing a portion of the transmitted analog electrical signal with a digital electrical signal, wherein the transmitted analog electrical signal is generated based at least in part on the digital electrical signal.

10. The method of claim 8, wherein determining magnitude, location, number, and type of the plurality of spurious emissions comprises:

determining a model that describes spurious emissions based at least in part on operational parameters of the radio frequency system, wherein the operational parameters comprise ambient temperature, transmission frequency, output power, antenna load, or any combination thereof;

determining the operational parameters; and inputting the operational parameters into the model.

11. An electronic device comprising: a radio frequency system configured to:

control output power of a wirelessly transmitted analog electrical signal based at least in part on a feedback signal, wherein the feedback signal comprises a portion of the transmitted analog electrical signal at a transmission channel and adjacent channels to the transmission channel;

determine low order intermodulation spurious emissions of the transmitted analog electrical signal in the transmission channel and adjacent channels by comparing the feedback signal to a desired signal, wherein the desired signal does not contain noise introduced by the radio frequency system, the low order intermodulation spurious emissions comprise a 3rd order intermodulation spurious emission, and location of the 3rd order intermodulation spurious emission is in the adjacent channels; determine high order intermodulation spurious emissions of the transmitted analog electrical signal outside of the transmission channel and adjacent channels based at least in part on a relationship between magnitude and location of the low order intermodulation spurious emissions and the high order intermodulation spurious emissions, wherein the high order intermodulation spurious emissions comprise a 5th order intermodulation spurious emission and location of the 5th order intermodulation spurious emission is in a channel that is two channel bandwidths from the transmission channel; and adjust operational parameters used to transmit subsequent analog electrical signals based at least in part on the low order intermodulation spurious emissions and the high order intermodulation spurious emissions.

12. The electronic device of claim 11, wherein magnitude of the 5th order intermodulation spurious emission has a 5:1 ratio when magnitude of the 3rd order intermodulation spurious emission has a 3:1 ratio.

13. The electronic device of claim 11, wherein the electronic device comprises a portable phone, a media player, a personal data organizer, a handheld game platform, a tablet device, a computer, or any combination thereof.

* * * * *